US008794150B2

(12) United States Patent
Theis et al.

(10) Patent No.: US 8,794,150 B2
(45) Date of Patent: Aug. 5, 2014

(54) APPARATUS AND METHOD FOR MICROCONTACT PRINTING ON INDEFINITE LENGTH WEBS

(75) Inventors: Daniel J. Theis, Mahtomedi, MN (US); Jonathan J. O'Hare, Oakdale, MN (US); Mikhail L. Pekurovsky, Bloomington, MN (US); Daniel P. Meehan, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 14/116,363

(22) PCT Filed: Jun. 25, 2012

(86) PCT No.: PCT/US2012/043933
§ 371 (c)(1),
(2), (4) Date: Nov. 8, 2013

(87) PCT Pub. No.: WO2013/003253
PCT Pub. Date: Jan. 3, 2013

(65) Prior Publication Data
US 2014/0102327 A1  Apr. 17, 2014

Related U.S. Application Data

(60) Provisional application No. 61/503,204, filed on Jun. 30, 2011.

(51) Int. Cl.
*B41F 17/00* (2006.01)
*B41F 13/02* (2006.01)
*B41M 1/26* (2006.01)

(52) U.S. Cl.
CPC .................................... *B41F 17/00* (2013.01)
USPC ............. 101/483; 101/216; 101/375; 492/17

(58) Field of Classification Search
USPC ......... 101/22, 23, 28, 32, 327, 328, 483, 375, 101/376, 216, 219; 492/4, 16, 17, 18
See application file for complete search history.

(56) References Cited

U.S. PATENT DOCUMENTS 4,053,277 A    10/1977  Bos
5,246,155 A     9/1993  Barrois
(Continued)

FOREIGN PATENT DOCUMENTS

WO  WO 2006/043244   4/2006
WO  WO 2013/003412   1/2013

OTHER PUBLICATIONS

Kumar, et al., "Features of gold having micrometer to centimeter dimensions can be formed through a combination of stamping with an elastomeric stamp and an alkanethiol 'ink' followed by chemical etching," Applied Physics Letters, vol. 63, Issue 14, 1993, pp. 2002-2004.

(Continued)

*Primary Examiner* — Leslie J Evanisko
(74) *Attorney, Agent, or Firm* — Adrian L. Pishko

(57) ABSTRACT

An apparatus and a method for micro-contact printing on a substrate. A roll having very low drag is supported for rotation by air bearings and has a micro-contact printing stamp mounted to its outer surface. Contact between the substrate and the micro-contact printing stamp drives the roll and repeatedly imprints the pattern onto the web. In convenient embodiments, the roll is a sleeve positioned over a core with the sleeve supported for rotation by a layer of air between the sleeve and the core.

17 Claims, 1 Drawing Sheet

(56) References Cited

U.S. PATENT DOCUMENTS

| | | |
|---|---|---|
| 5,392,711 A | 2/1995 | Kainuma |
| 5,512,132 A | 4/1996 | Stewart |
| 6,467,893 B1 | 10/2002 | Matsumoto |
| 6,468,893 B2 | 10/2002 | Ueoka |
| 6,517,928 B1 | 2/2003 | Onogawa |
| 6,641,513 B1 | 11/2003 | Ward |
| 6,739,255 B2 | 5/2004 | Blees |
| 2003/0047535 A1 | 3/2003 | Schueller |
| 2003/0089261 A1 | 5/2003 | Landsman |
| 2003/0114283 A1* | 6/2003 | Kaluza et al. .................... 492/4 |
| 2004/0134596 A1 | 7/2004 | Rosati |
| 2008/0289524 A1* | 11/2008 | Jongerius .................. 101/376 |
| 2011/0067234 A1 | 3/2011 | Theis |
| 2011/0126730 A1 | 6/2011 | Berniard |

OTHER PUBLICATIONS

Xia, et al., "Microcontact Printing with a Cylindrical Rolling Stamp: A Practical Step Toward Automatic Manufacturing of Patterns with Submicrometer-Sized Features," Advanced Materials, vol. 8, No. 12, pp. 1015-1017, 1996.

PCT International Search Report, PCT/US2012/043933, 3 pages, dated Jan. 3, 2013.

* cited by examiner

APPARATUS AND METHOD FOR MICROCONTACT PRINTING ON INDEFINITE LENGTH WEBS

CROSS REFERENCE TO RELATED APPLICATIONS

This application is a national stage filing under 35 U.S.C. 371 of PCT/US2012/043933, filed Jun. 25, 2012, which claims priority to Provisional Application No. 61/503204, filed Jun. 30, 2011, the disclosure of which is incorporated by reference in its/their entirety herein.

The present invention is related to a method of applying a discontinuous layer of material in a pattern having very fine features onto a web of indefinite length material.

BACKGROUND

It is known to employ high resolution micro-contact printing to produce fine patterns on a flexible web. One of the unique characteristics of the articles created by micro-contact printing are the small scale features the process is capable of generating suitable for use in the electronics industry. Specifically, patterns constructed of lines with line widths smaller than 10 microns having high optical transmission and relatively high electrical conductivity can be prepared over a large area. This small line width size, along with a low density of the lines, is enabled by very fine patterning of the micro-contact printing stamp to produce materials suitable for use as a touch screen.

SUMMARY

While Roll to Roll (R2R) processing is generally considered a desired path for performing micro-contact printing, the process requirements for micro-contact printing impose limitations that often result in printing defects when using conventional driven rolls, idlers and web paths scenarios. One of the primary issues to address in the R2R micro-contact printing process is related to the transfer of ink from the printing stamp to a functional layer, e.g. the transfer of thiol onto a thin metallic silver layer on a polymeric substrate. Since the patterns being generated are often very small, any relative movement between the ink laden stamp and the substrate, once contact is made, can introduce inaccuracy, distortion, or double images in the resulting printed pattern. Consistent and low contact pressure between the stamp and the substrate are required to insure the very small features on the stamp are not distorted and the thin lines on the stamp's surface are not compressed or collapsed. Additionally, a consistent and precise speed match between the stamp's surface speed and the surface speed of the substrate is needed to prevent smearing and distortion in the resulting printed pattern.

The inventors have discovered that the micro-contact printing stamp can be attached to an air bearing roller and contacted with the substrate to print the patterns. In connection with the present invention, an air bearing roller with extremely low mechanical drag presents a potentially ideal environment for a micro-contact printing stamp support. It enables extremely low surface shear forces at the stamp/substrate boundary, which in turn allows an excellent surface speed match between the stamp's surface and the substrate. In some embodiments, a thin shell is supported by an air bearing providing an air support cushion layer and low roller inertia to dramatically reduce the incidence of particular modes of print failure often observed when the stamp is mounted on a driven roll or on a roll with significant drag. By supporting the thin shell on a cushion of air, increased compliance is present when contacting the micro-printing stamp with the substrate helping to prevent excessive compression of the thin traces present on the stamp's surface due to excessive nip loading, web tension variations, or out of round web rollers.

In one embodiment, the invention resides in a method of applying a pattern onto a web of indefinite length material comprising: applying a micro-contact printing stamp to a roll supported for rotation by at least one air bearing; contacting the roll with the web, and translating the web while in contact with the micro-contact printing stamp so as to repeatedly imprint a pattern onto the web.

In another embodiment, the invention resides in an apparatus for applying a pattern onto a web of indefinite length comprising: a roll comprising a sleeve positioned over a core with the sleeve supported for rotation by a layer of air between the sleeve and core; a micro-contact printing stamp mounted onto an outer surface of the sleeve, the micro-contact printing stamp saturated with thiol; and a web path along which the web is guided such that the web contacts the micro-contact printing stamp and rotates the sleeve.

As used herein, a micro-contact printing stamp is a member having raised stamping features with at least one dimension of the contacting surface of the raised stamping feature having a width less than 20, 10, or 5 microns. In many embodiments, a micro-contact printing stamp has a plurality of raised lines for printing electrical circuit patterns and the width of the raised lines and resulting printed traces is less than 20, 10, or 5 microns.

BRIEF DESCRIPTION OF THE DRAWINGS

In describing the embodiments of the invention, reference is made to the various Figures in which the features of the depicted embodiments are identified with a reference numeral with like reference numerals indicating like structures and wherein.

DETAILED DESCRIPTION

The method and apparatus provides an answer for two of the primary requirements in the R2R high resolution micro-contact printing process: the low drag of the air bearing supported roll allows for an excellent surface speed match between the web and the micro-contact printing stamp mounted on the roll while simultaneously allowing for a relatively small contact force between the web and the stamp while printing to drive the roll.

Figure 1:
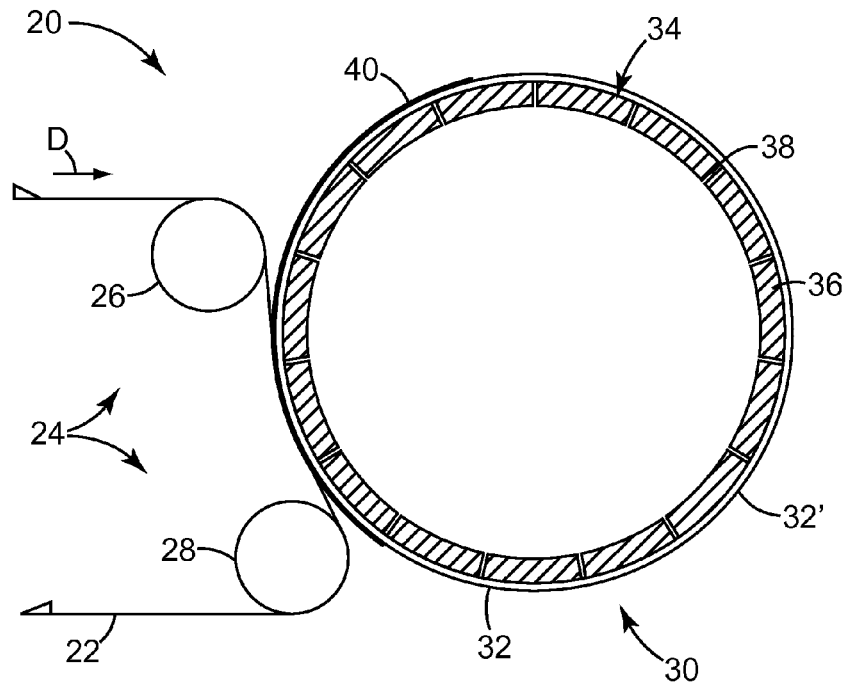
FIG. 1 is a schematic view of an apparatus for carrying out a micro-contact printing method.

Referring to FIG. 1, a schematic view of an apparatus 20 according to the present invention is illustrated. A web 22 of indefinite length is conveyed in direction D along a web path 24, which in the depicted embodiment comprises an entry roller 26 and an exit roller 28 positioned such that the web 22 touches or wraps at least a portion of stamp roll assembly 30. In many convenient embodiments, the entry roller 26 and the exit roller 28 are idle rollers, but having one or the other or both as driven rollers is considered to be within the scope of the invention. The invention can be used with webs 22 of any of a variety of materials. In particular, web 22 may be a polymeric material such as polyethylene terephthalate (PET), polyethylene naphthalate (PEN), polycarbonate, and polyimide. Such substrates might conveniently be coated with a thin metal layer such as silver, gold, copper, nickel, or others.

Web path 24 conveys the free span of web 22 between entry roller 26 and exit roller 28 into touching contact with stamp roll assembly 30. Stamp roll assembly 30 includes a roll 32 having a very low drag. In the embodiment of the invention illustrated in FIG. 1, the very low drag of roll 32 is provided in one embodiment by mounting sleeve 32' on an air bearing 34. Sleeves can be built out of metals, combination of layers of metals, from composite materials that include PAN carbon fibers, pitch carbon fibers, para-aramid fibers, Kevlar fibers, and glass fibers, or from combination of layers of metals and polymeric materials, for example elastomers like rubbers. These fiber-based materials are impregnated with polymeric materials that could include epoxies, polyesters, and vinylesters. Examples of metals suitable for building sleeves include nickel, copper, nickel/cobalt, titanium, and aluminum. A thin shell of carbon composite is also believed to be suitable for use as a sleeve.

In some convenient embodiments, sleeve 32' is composed primarily of nickel. More particularly, a sleeve composed of nickel having a thickness of between about 3 mils (0.076 mm) and 15 mils (0.381 mm), or even between about 4 mils (0.102 mm) to 6 mils (0.152 mm), has been found to be suitable. A sleeve with a length of 15 inches (38.1 cm) and thickness of 10 mil and an outer diameter of 8.7 inches (22.1 cm) has a rotational moment of inertia of only 25 lb-in$^2$ (718 N-cm$^2$) which is advantageous in the disclosed micro-contact printing since the inertia of the sleeve must be driven by the substrate. The sleeve or roll is not connected to a drive and freely rotates about its axis. Lower inertia sleeves or rolls can help to minimize printing defects. Changes in web velocity, however small, can cause frictional forces at the substrate-stamp interface that lead to printing defects. These forces are proportional to rotational velocity of the micro-contact printing stamp-supporting roll. The higher the rotational inertia of the roll, the higher is the force caused by fluctuations in web velocity. While different diameter and/or length sleeves (rolls) can be used, the rotational moment of inertia of the roll or sleeve can be less than 150, 100, 50, or 30 lb-in$^2$ (4300, 2875, 1438, or 860 N-cm$^2$) in various embodiments of the invention.

In one embodiment air bearing 34 conveniently comprises a non-rotating steel core 36 having apertures 38 for the egress of an airflow that rotationally supports roll 32. Heaters or coolers may be placed in or adjacent to the core 36 or the air supply to add or remove heat from roll 32 if desired to control the temperature of the micro-contact printing stamp.

Rotating elements, including rolls and shells, generate some amount of friction at the bearing surfaces. That friction varies greatly with different choices of bearings that could include plain bearings, roll bearings, and air bearings. In general, the coefficient of friction of plain bearings is 0.1, of roller bearings is 0.001, and of air bearings is 0.00001. An idler roll with a micro-contact printing stamp supported for rotation by standard bearings instead of an air bearing was found not to work reliably due to unacceptable levels and the inconsistency of the friction present.

The variation in friction is also an undesirable property of a plain and roller bearings. The variation of friction is present due to the dependence of the coefficient of friction on the velocity, with static coefficient of friction in plain and rolling bearings being the highest. Air bearings, however, are completely free from variations in friction due to rotational velocity.

Other important characteristics of bearing surfaces are heat generation, wear, stiffness, and load capacity. Air bearings can reduce heat generation, wear, and have adjustable stiffness (compliance) and large load capacities. It is believed that this compliance can be desirable when mounting a micro-contact printing stamp to the roll to help reduce printing disturbances. In micro-contact printing applications, it is desirable to have conformability of contact between the micro-contact printing stamp and the printing surface. Conformability is needed to compensate for non-uniformity of the substrate's thickness, the micro-contact printing stamp's thickness and the roll's run-out. Typical methods for achieving conformability in micro-contact printing includes building stamps out of elastomeric materials, inserting layers of deformable foam or low modulus polymers between the micro-contact printing stamp and the mounting surface. In an air bearing, conformability can be controlled by the air gap distance between the opposed bearing surfaces as well as by the air flow. In some embodiments, a foam layer is no longer needed when mounting the micro-contact printing stamp to the roll or sleeve supported by one or more air bearings.

There are a number of air bearing technologies that are in use today such as aerodynamic bearings and aerostatic bearings. Aerodynamic bearings rely on relative motion between bearing surfaces and is similar to hydroplaning. Aerodynamic bearings are also known as foil bearings or self-acting bearings. Examples of such bearings include the read-write head of hard-drives and crankshaft journals. Aerostatic bearings require an external pressurized air source. That air pressure is introduced between the bearing surfaces by holes, grooves, porous elements, or steps. Aerostatic bearings maintain an air gap without relative motion of bearing surfaces. Depending on the method of supplying air to the gap between bearing surfaces, the air bearing can be classified either as orifice or porous media bearings. In orifice bearings, the air is supplied through a number of holes. In porous media bearings, air is supplied though the entire surface of the bearing. Porous air bearings can be made out of porous metals, porous plastics, and other porous materials, like porous carbon. For roller or sleeve 32 different air bearings can be used: air sleeves, air bushings, vacuum-preloaded bearings, and radial bearings.

A micro-contact printing stamp 40 is mounted on roll 32, and may cover all or only part of its circumference. Micro-contact printing stamps made from polydimethylsiloxane (PDMS) as described in copending and coassigned U.S. Patent application attorney docket no. 67385US002, "Method for Making, Inking, and Mounting Stamps for Micro-Contact Printing," filed on Jun. 30, 2011 and having U.S. Ser. No. 61/503,220 are considered particularly suitable. Other suitable micro-contact printing stamps can be made from diverse polymeric materials. Suitable polymeric materials include silicone polymers, epoxy polymers, acrylate polymers, saturated and unsaturated rubbers. Unsaturated rubbers can include: natural polyisoprene, synthetic polyisoprene, polybutadiene, chloroprene rubber, butyl rubber, halogenated butyl rubbers, styrene-butadiene rubber, nitrile rubber, and hydrogenated Nitrile Rubbers. Saturated rubbers can include ethylene propylene rubber, ethylene propylene diene rubber, epichlorohydrin rubber, polyacrylic rubber, silicone rubber, fluorosilicone rubber, fluoroelastomers, perfluoroelastomers, polyether block amides, chlorosulfonated polyethylene, and ethylene-vinyl acetate.

Micro-contact printing stamps can be made by a number of methods that include: casting against masters, selective curing by actinic radiation or heat, surface machining, or laser ablation. The micro-contact printing stamp can be made from one material, have multiple layers of different materials, or can have a composite structure. Micro-contact printing stamps can be pre-made and then mounted on a rotatable surface with help of adhesive tapes, magnetic fields, or vacuum. Alternatively, micro-contact printing stamp material can be initially deposited on a rotatable surface, with a curing step following, and with a pattern making step finishing the stamp.

The micro-contact printing stamp can include multiple layers of metals, woven and non-woven fibrous materials, rigid polymers, like PET, and foams. Foams are also referred to as expanded or sponge plastics and have at least two phases, a polymer matrix and gaseous phase. Polymeric matrix can have fillers of either inorganic nature, such as glass, ceramic or metal, or of polymeric nature. Foam cell geometry can be open or closed. Suitable foams can have a range of densities from 0.1 lb/ft$^3$ to 70 lb/ft$^3$. Using a layer of foam between the micro-contact printing stamp and the mounting roll can provide additional compliance improving the print quality.

It is usually desirable for web 22 to make very light contact with the micro-contact printing stamp 40. A contact pressure of less than 2 psi (13.7 kPa) is considered suitable, or even less than 1 psi (6.9 kPa), or further even less than 0.5 psi (3.4 kPa). Additionally, it may be desirable that the web 22 be in contact with the micro-contact printing stamp for a short time. For example the web 22 may be contact with less than 50% of the circumference of the roll, less than 25%, or even less than 15%, or further even less than 5%. In some embodiments the web 22 is in contact with the outer circumference of the sleeve or roll for 2-4 inches (5.1-10.2 cm) of surface arc such as 3 inches (7.6 cm). The wrap angle is dependent on web speed and tension since increasing the wrap assists in driving sleeve 32' but can result in reduced print quality if registration is lost. Shorter wrap angles can improve print quality, but may not have sufficient contact to drive the sleeve. In general, it is desirable for the micro-contact printing stamp and web to contact each other for at least 3-5 milliseconds such as for 4 milliseconds. Longer contact times can increase the printed width of the pattern on the substrate undesirably. A minimum contact duration is needed to form an assembled monolayer with the thiol solution on the substrate, but increasing that time too much leads to the printed line width widening, and increases the likelihood of smearing or double printed images due to relative motion between the surfaces during printing. Thus, the speed of the substrate should also be considered when deciding on the wrap angle to ensure a desirable contact time duration.

The diameter of the sleeve/roller can vary and is often sized to be a convenient repeat of the micro-contact printing pattern. Smaller diameters are preferred due to lower inertia and reduced air entrainment, but often pattern geometry and the ultimate size of the printing pattern dictate the diameter of the sleeve or roller.

The tension of the web can vary. Higher tensions can be used to generate more driving force for the sleeve or roll and reduce air entrainment, but also can lead to a collapse of the printing features on the micro-contact printing stamp. Suitable tensions can be in the range of 1-2 pound/linear inch (1.75 to 3.5 Newton/linear cm) depending on the wrap angle of the substrate on the roll or sleeve.

In some convenient embodiments, one or more of entry roller 26, exit roller 28, or stamp roll assembly 30 may be on adjustable mounts so as to readily change the contact pressure and/or the percentage of the circumference of roll 32 over which contact between the web 22 and the stamp 40 is occurring can be adjusted.

Precise lateral control over the position of the roll 32 is desirable for accurate printing. Expedients for controlling the lateral position of a thin shell roll can be found in copending and coassigned U.S. patent application Ser. No. 12/993,138 entitled, "Method for Continuous Sintering on Indefinite Length Webs," filed on May 20, 2009 which is hereby incorporated by reference in its entirety.

Figure 2:
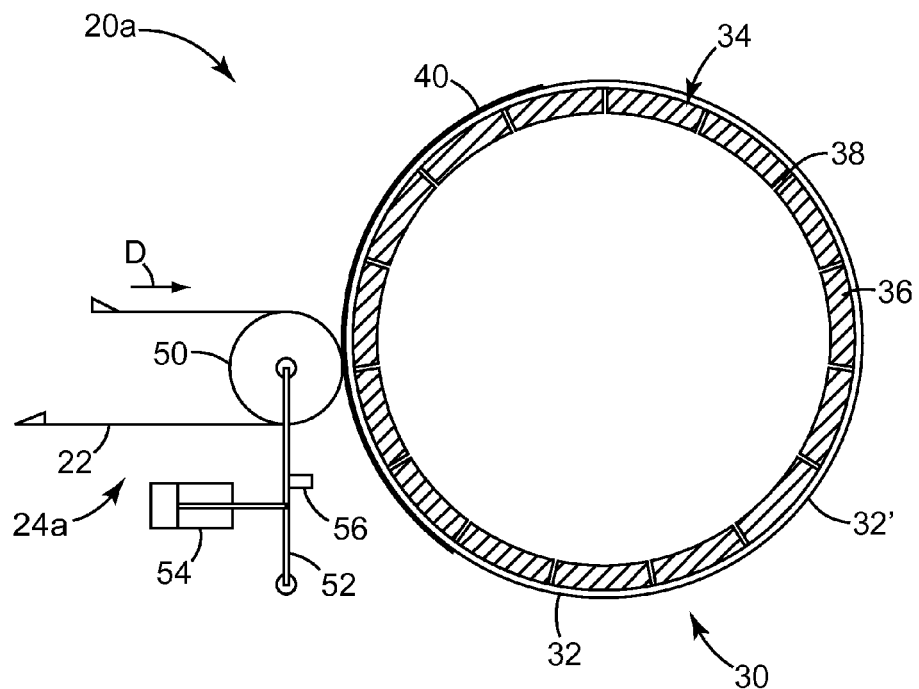
FIG. 2 is a schematic view of an alternate embodiment of an apparatus for carrying out a micro-contact printing method.

Referring to FIG. 2, a schematic view of an alternate embodiment of an apparatus 20a for carrying out a method according to the present invention is illustrated. In this embodiment, an alternate web path 24a is employed to convey web 22 in direction D into touching contact with stamp roll assembly 30. The web 22 is maneuvered into touching contact at a nip between nip roller 50 and the stamp roll assembly 30. In the depicted embodiment, nip roller 50 is mounted on pivot arm 52. The contact force is controlled by a force controller, embodied as a pneumatic cylinder 54 connected to the pivot arm 52. A position stop 56 is sometimes desirable for providing an absolute limit on the movement of the positioning roller 50 towards the thin shell roll 32.

In another embodiment, the thin shell and air bearing in FIGS. 1 and 2 can be replaced by an conventional dead shaft or live shaft roll supported for rotation by air bearings located on opposing ends of the roll. Such a system would have low drag forces, but would not have a compliant layer of air between the sleeve and the core. A carbon fiber roll could be used to minimize the rotational moment of inertia present.

The method of the present invention is conveniently used for printing onto an indefinite length web of polymeric material such as polyolefin, polyester phthalate, and polyimide films. Metallic surfaces can also be used as printing substrates in connection with the present invention. The metallic surface can include, for example, elemental metal, metal alloys, intermetallic compounds, metal oxides, metal sulfides, metal carbides, metal nitrides, and combinations thereof. Exemplary metallic surfaces for supporting self-assembled monolayers include gold, silver, palladium, platinum, rhodium, copper, nickel, iron, indium, tin, tantalum, as well as mixtures, alloys, and compounds of these elements.

EXAMPLE 1

An experimental set-up was prepared similar to that depicted in FIG. 1. A web of indefinite length polyethylene terephthalate (PET), 8 inches (20.3 cm) wide and 0.005 inch (0.127 mm) thick, commercially available as ST504 film from DuPont of Wilmington, DE, which had been coated with a 100 nm layer of silver by conventional sputtering, was threaded up. The experimental set-up included a roll in the form of a thin shell of primarily nickel, 8.658 inches (21.906 cm) in diameter and 0.010 inch (0.254 mm) thick, commercially available as Nickel Sleeve from Stork Prints America of Charlotte, N.C.

The nickel shell was mounted around a non-rotating steel supporting core with a plurality of apertures serving as an air bearing. Air pressure of 40 inches of water (0.10 kg/cm$^2$) was provided to the core to support the shell.

A micro-contact printing stamp was prepared from polydimethylsiloxane (PDMS) according to the description associated with FIGS. 1-11 in copending and coassigned U.S. Patent application atty. docket no. 67385US002, "Method for Making, Inking, and Mounting Stamps for Micro-Contact Printing." The micro-contact printing stamp was then saturated with a 200 mmol solution of C16 thiol in ethanol. The micro-contact printing stamp was then adhered to the nickel shell by double-sided adhesive tape in a configuration according the description associated with FIG. 14a in copending US Patent application attorney docket number 67385US002, "Method for Making, Inking, and Mounting Stamps for Microcontact Printing." Application of the micro-contact printing stamp to the roll was accomplished using a carriage having an upper platen on which the stamp was supported. The upper platen could be raised and lowered for vertical Z translation by a low friction pneumatic cylinder positioned between the upper platen and the carriage. The carriage was moved along linear bearings in the X direction by an actuator. As the carriage was translated, the roll was rotated and the stamp was transferred to the roll and adhered with adhesive to the surface of the roll. Other methods, including positioning or placing by hand can be used to mount the stamp to the roll, but may introduce undesired distortion in the micro-contact printing stamp. The experimental set-up was adjusted so that the web was in contact with the micro-contact printing stamp for 10% of the circumference of the thin shell roll. The web was then advanced at a line speed of 10 feet/minute (3.05 m/min) at a web tension of 1 pound per linear inch (1.75 N/linear cm). After the run, a solution of thiourea and ferric nitrate was used to etch the silver where the deposited PDMS had not protected it. Then, the traces of silver left on the web were inspected by optical microscope and it was observed that the traces reproduced the pattern of the stamp quite accurately making a suitable grid for use as a touch screen for electronics.

EXAMPLES 2 and 3

An arrangement similar to FIG. 1 was run, but the tangent of the web wrap on the roll was located at approximately 10:00 o'clock instead of 8:00 o'clock as shown since the entry roller was positioned at 12:00 o'clock. The web wrap was approximately 3 inches (7.6 cm) of circumference. A micro-contact PDMS printing stamp, inked with thiol was printed on a silver sputtered PET substrate. The print roll is an idler that is driven by the substrate with the PDMS micro-contact printing stamp attached to the print roll. Two types of print rolls were compared by printing under identical conditions to each other and analyzing the quality of the resulting prints.

The first print roll that was used was a nickel sleeve that floated on the surface of the core using air pressure. The nickel sleeve was 10 mil thick material and had an outer diameter (OD) of 8.7 inches (22.1 cm). A gap of approximately 10 mil (0.025 mm) was present between the inner diameter of the sleeve and the out diameter of the core. The air sleeve core had a pattern of small holes drilled through it which connect the outer surface to an inner manifold, which was fed by an air blower. This blower was run so that the manifold pressure of the core was maintained at 50 inches of $H_2O$ (12.54 kPa). By floating the nickel shell on the core, a print roll having very low inertia and drag was created. It also had the benefit of having an air gap between the sleeve and core to act as a cushion for the printing process.

The second print roll used was a dead shaft aluminum idler roll with the an outer diameter of 8.7 inches (22.1 cm), a 15 inch (38.1 cm) face length, and a ⅛ inch (0.32 cm) wall thickness. This idler had significantly higher rotational inertia (approximately 103 lb-in$^2$ versus approximately 25 lb-in$^2$ for the nickel sleeve) as well as significantly higher drag, since standard roller bearings were used. There was also no compliant air layer in the system, which the first print roll had.

Both experiments were run at the following line conditions:
Line Speed—15 ft/min (4.6 m/min)
Line Tension—20 lbs (138 kPa)
Substrate Width—10 inches (25.4 cm)
Stamp Width—8.75 inches (22.2 cm)
Stamp Thickness—2.37 mm
Print Diameter—8.7 inches (22.2 cm)
Substrate/Stamp Contact Length—3 inches (7.6 cm)
Stamp Pre-inking Before Mounting: 200 mmolar C16 in Ethanol, 4 hours saturation time
Stamp Mounting Adhesive—3 M 2 mil 9122 Silicone Adhesive The micro-contact printing stamps used on each roll were the same and designed to have printed line widths of less than 3 µm on the substrate. The experiments were run with all conditions being identical to each other for the two print rolls. The printed substrates were then etched identically and 24 line width measurements were taken on the resulting silver traces obtained from each printing roll.

The results are listed in Table 1 on page 13. Roll 1 using the nickel sleeve had an average line width of 2.92 µm. Roll 2 using the aluminum idler had an average line width of 3.57 µm. Additionally, the spread between the maximum measurement and the minimum measurement was twice as large for the aluminum idler than for the air sleeve, which shows that it result in a significantly less robust and reliable printing method.

TABLE 1

| | 15 fpm, 20 lb tension | |
| --- | --- | --- |
| Section | Air Sleeve (110323-Stamp 1) Line Width (µm) | Al. Idler (110330- Stamp 3) Line Width (µm) |
| 1 | 3.03 | 3.67 |
| 2 | 2.90 | 3.57 |
| 3 | 2.91 | 3.45 |
| 4 | 2.93 | 3.39 |
| 5 | 2.88 | 3.17 |
| 6 | 3.09 | 3.25 |
| 7 | 2.97 | 4.17 |
| 8 | 2.81 | 3.98 |
| 9 | 2.68 | 3.43 |
| 10 | 2.74 | 3.31 |
| 11 | 2.84 | 3.11 |
| 12 | 3.19 | 3.30 |
| 13 | 2.80 | 4.68 |
| 14 | 2.79 | 4.51 |
| 15 | 2.79 | 3.76 |
| 16 | 2.75 | 3.31 |
| 17 | 2.78 | 3.13 |
| 18 | 3.42 | 3.17 |
| 19 | 2.93 | 4.00 |
| 20 | 2.95 | 4.30 |
| 21 | 2.92 | 3.56 |
| 22 | 2.89 | 3.27 |
| 23 | 2.90 | 3.03 |
| 24 | 3.22 | 3.13 |
| Average | 2.92 | 3.57 |
| min | 2.68 | 3.03 |
| max | 3.42 | 4.68 |
| Spread | 0.73 | 1.64 |

While the invention has been particularly shown and described with reference to various embodiments thereof, it will be understood by those skilled in the art that various other changes in the form and details may be made therein without departing from the spirit and scope of the invention.

What is claimed is:

1. A method of applying a pattern onto a web of indefinite length material comprising:
   applying a micro-contact printing stamp to an outer surface of a roll supported for rotation by at least one air bearing, wherein the roll comprises a sleeve positioned over a core and the air bearing comprises a layer of air between the sleeve and core such that the sleeve is supported for rotation;
   contacting the micro-contact printing stamp with the web; and translating the web while in contact with the micro-contact printing stamp so as to repeatedly imprint a pattern onto the web such that the sleeve supported over the core by the layer of air rotates.

2. A method according to claim 1 wherein the contact between the web and the roll drives the roll while the web is being translated.

3. A method according to claim 1 wherein the sleeve is primarily composed of nickel.

4. A method according to claim 1 wherein the sleeve is from 3 mils (0.076 mm) to 15 mils (0.381 mm) thick.

5. A method according to claim 1 wherein the roll has a rotational inertia less than 150 lb-in$^2$ (4300 N-cm$^2$).

6. A method according to claim 1 wherein the web is conveyed so that a free span of the web is in contact with the roll.

7. A method according to claim 6 wherein the web is in contact with the micro-contact printing stamp for less than 25% of the circumference of the roll.

8. A method according to claim 6 wherein the web is in contact with the micro-contact printing stamp for at least 3-5 milliseconds.

9. A method according to claim 1 wherein the web contacts the roll at a nip.

10. An apparatus for applying a pattern onto a web of indefinite length comprising:
    a roll comprising a sleeve positioned over a core with the sleeve supported for rotation by a layer of air between the sleeve and core;
    a micro-contact printing stamp mounted onto an outer surface of the sleeve, the micro-contact printing stamp saturated with thiol and being configured to contact the web such that the contact between the web and the micro-contact printing stamp rotates the sleeve supported by the layer of air and positioned over the core; and
    a web path along which the web is guided into contact with the micro-contact printing stamp along at least a portion of the outer surface, wherein the contact between the web and the micro-contact printing stamp rotates the sleeve.

11. An apparatus according to claim 10 wherein the sleeve is from 5 mils (0.127 mm) to 15 mils (0.381 mm) thick.

12. An apparatus according to claim 10 wherein the web path comprises an entry roller and a take-off roller, such that a free span of the web contacts the micro-printing stamp.

13. An apparatus according to claim 12 wherein the free span is in contact with the sleeve for less than 25% of the circumference of the sleeve.

14. An apparatus according to claim 12 wherein the web is in contact with the micro-contact printing stamp for at least 3-5 milliseconds.

15. An apparatus according to claim 10 wherein the web path comprises a positioning roller, such that the web contacts the micro-contact stamp at a nip between the positioning roller and the sleeve.

16. An apparatus according to claim 15 wherein the positioning roller is mounted on a pivot arm, and wherein the contact force between the positioning roller and the sleeve is controlled by a force controller.

17. An apparatus according to claim 16 comprising a position stop for limiting the movement of the positioning roller towards the sleeve.

* * * * *